(12) United States Patent
Cai et al.

(10) Patent No.: US 10,468,427 B2
(45) Date of Patent: Nov. 5, 2019

(54) POLY-INSULATOR-POLY (PIP) CAPACITOR

(71) Applicant: GLOBALFOUNDRIES Singapore Pte. Ltd., Singapore (SG)

(72) Inventors: Xinshu Cai, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 56 days.

(21) Appl. No.: 15/877,394

(22) Filed: Jan. 23, 2018

(65) Prior Publication Data
US 2019/0229122 A1 Jul. 25, 2019

(51) Int. Cl.
*H01L 27/115* (2017.01)
*H01L 27/11521* (2017.01)
*H01L 49/02* (2006.01)
*H01L 27/11526* (2017.01)
*H01L 29/423* (2006.01)

(52) U.S. Cl.
CPC .. *H01L 27/11521* (2013.01); *H01L 27/11526* (2013.01); *H01L 28/60* (2013.01); *H01L 29/42328* (2013.01)

(58) Field of Classification Search
CPC ............... H01L 27/11521; H01L 28/60; H01L 27/11526; H01L 29/42328; H01L 27/11511; H01L 27/11514; H01L 27/11517; H01L 27/11524; H01L 27/11528; H01L 27/11529; H01L 27/2924; H01L 27/1451
See application file for complete search history.

(56) References Cited

U.S. PATENT DOCUMENTS

| | | | |
|---|---|---|---|
| 6,747,310 B2 | 6/2004 | Fan et al. | |
| 9,728,543 B1 * | 8/2017 | Pan | H01L 29/66545 |
| 2001/0026973 A1 | 10/2001 | Yeh et al. | |
| 2002/0155664 A1 * | 10/2002 | Noro | H01L 27/115 438/263 |
| 2013/0076335 A1 * | 3/2013 | Lin | H01L 29/94 323/364 |
| 2016/0190146 A1 * | 6/2016 | Zhang | H01L 27/11521 257/319 |

* cited by examiner

*Primary Examiner* — Thanh T Nguyen
(74) *Attorney, Agent, or Firm* — Thompson Hine LLP; Anthony Canale

(57) ABSTRACT

Devices and methods of forming a device are disclosed. A substrate is prepared with a memory region and a capacitor region. Split non-volatile memory (NVM) cell may be formed in the memory region and a capacitor may be formed in a capacitor region. The split NVM cell and the capacitor are formed with the same gate electrode and dielectric layers. The capacitor may be a poly-insulator-poly (PIP) which may include first and second capacitor control gate stacks or capacitor plates. In the case of capacitor control gate stacks, the capacitor is integrated into the device without the need of an additional mask. In the case of capacitor plates, the capacitor is integrated into the device with only one additional mask.

12 Claims, 12 Drawing Sheets

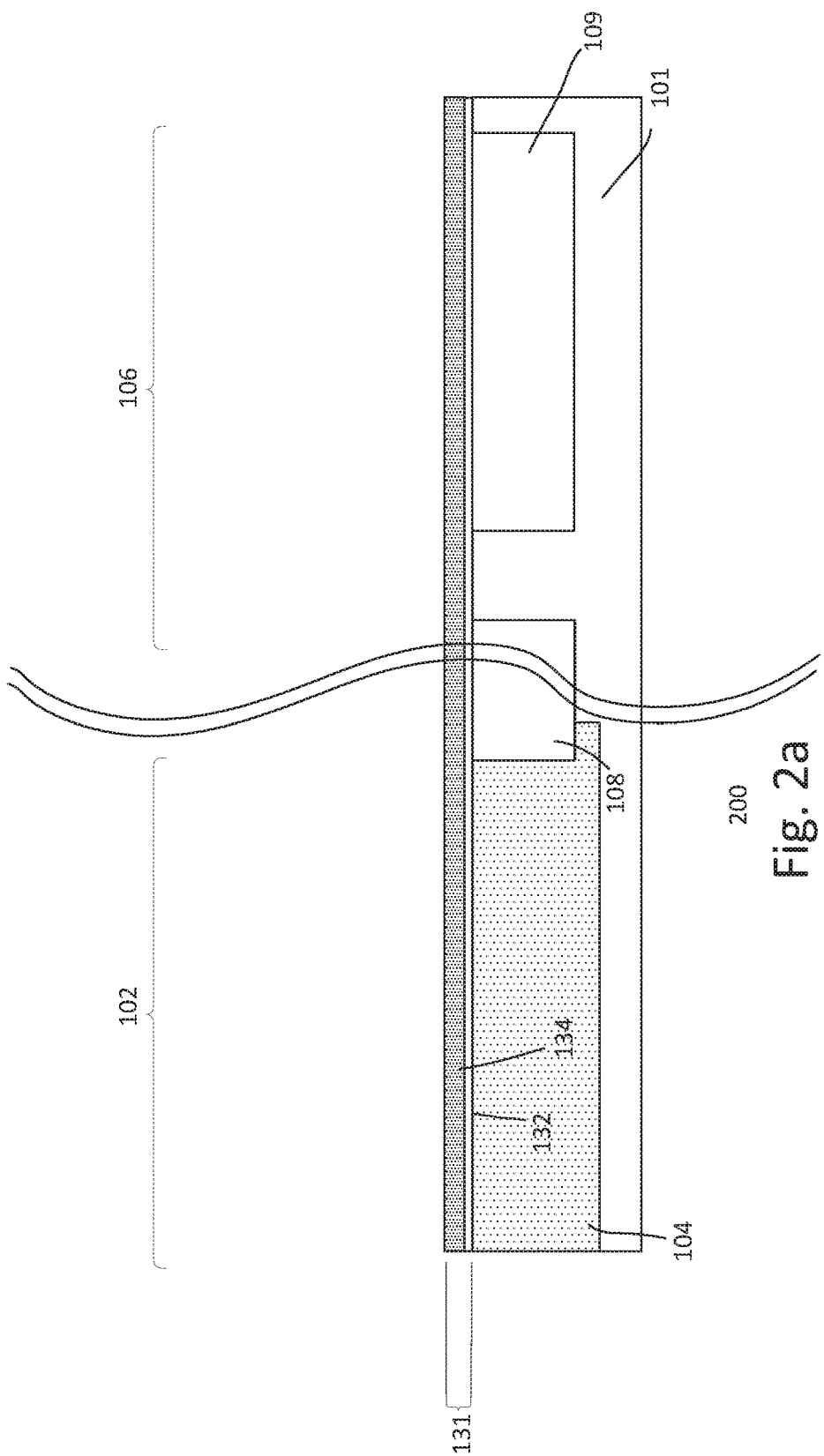

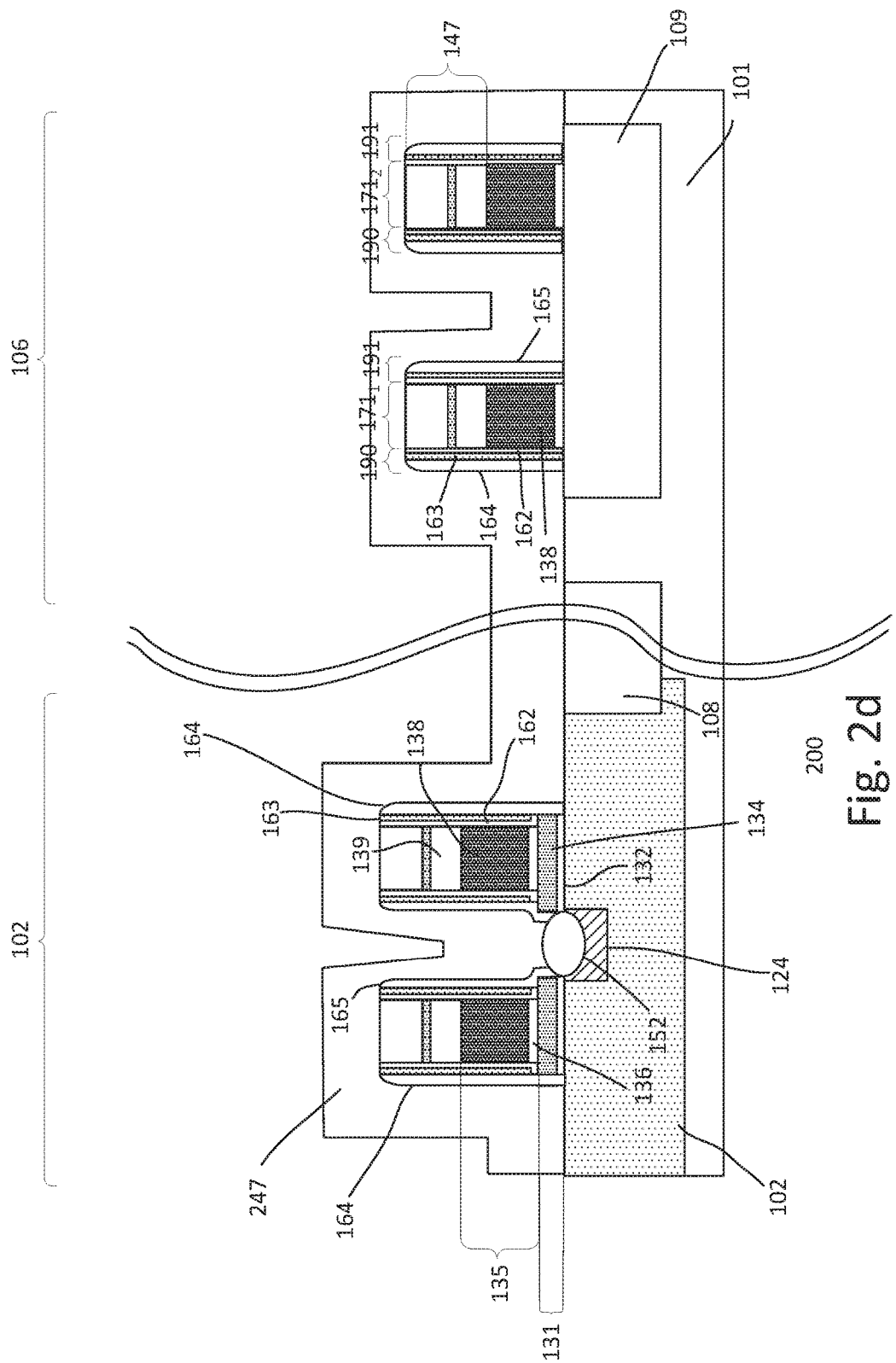

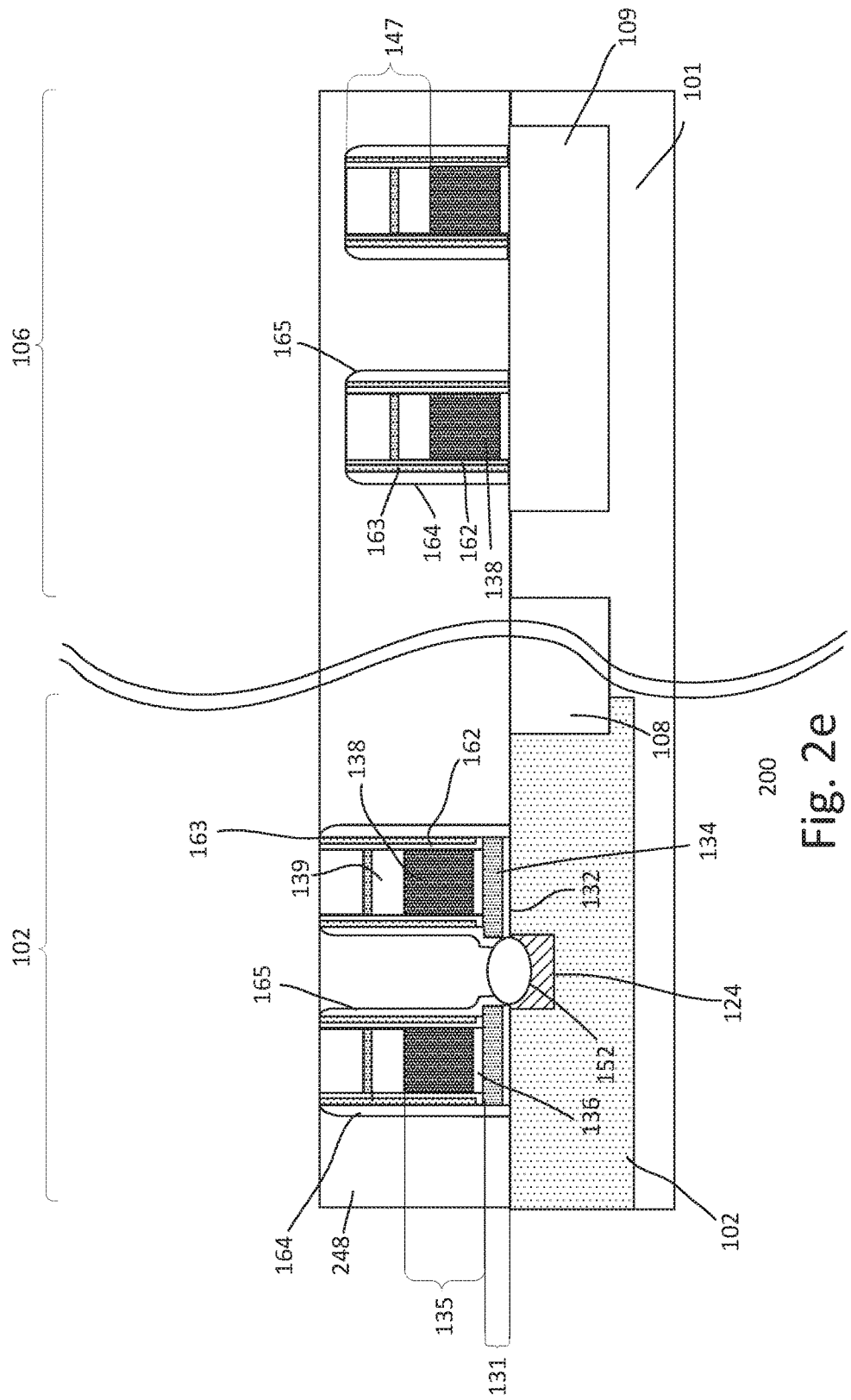

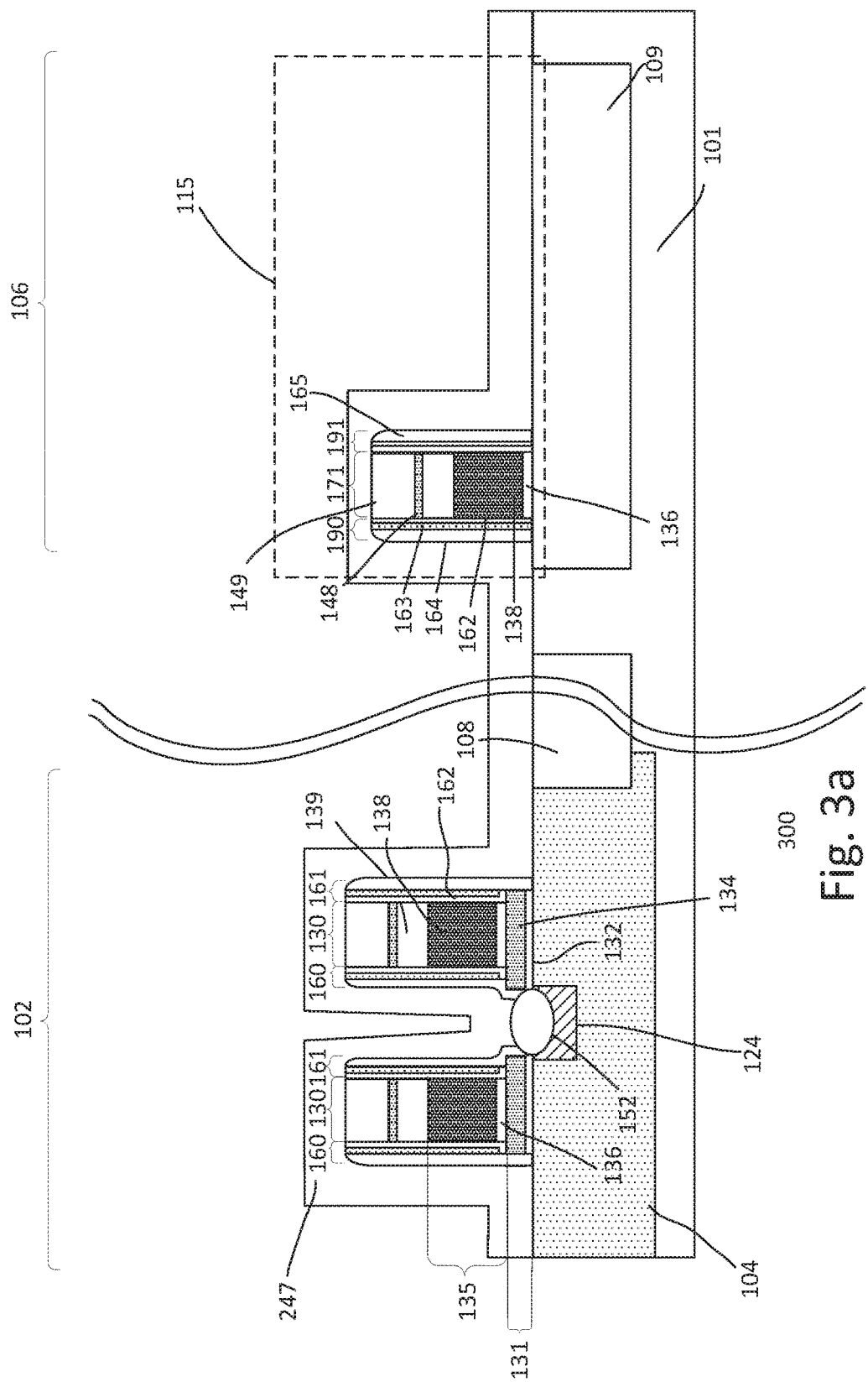

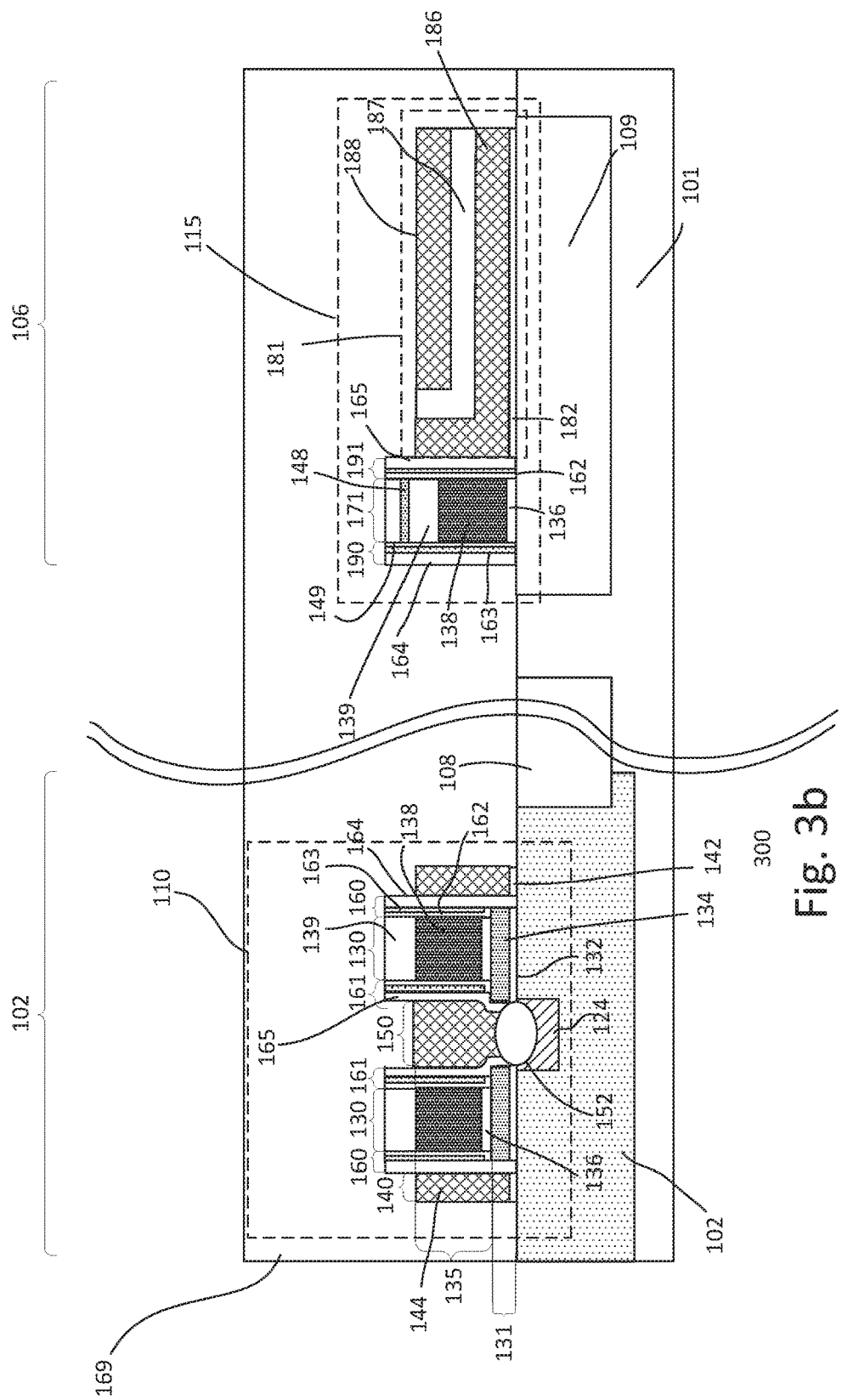

POLY-INSULATOR-POLY (PIP) CAPACITOR

FIELD OF THE INVENTION

The present disclosure relates to the field of semiconductor devices. More particularly, this disclosure relates to poly-insulator-poly (PIP) capacitors.

BACKGROUND

Split gate non-volatile memory (NVM) integrated circuits (ICs) have achieved widespread adoptions for code and data storage applications. An important aspect of split gate NVM circuits is their performance, which includes endurance (number of programming or write/erase cycles) and data retention after write/erase cycling. For example, split gate embedded flash memory technology has a wide range of embedded non-volatile applications that require very high endurance and low power consumption.

On the other hand, capacitors are also widely used in ICs. Conventional capacitors, such as metal-insulator-metal (MIM) capacitors, metal-on-metal (MOM) capacitors or PIP capacitors, have been embedded into NVM ICs. However, embedding such conventional capacitors require multiple additional masks and are not conducive to high voltage (HV) capacitor applications, such as 5V. In addition, such capacitors usually have large footprints. For example, MOM capacitors employ low k dielectric of the intermetal dielectric (IMD) as the capacitor dielectric. The use of low k dielectric requires larger spacers, particularly for HV applications. This undesirably increases the footprint of the capacitor or device. Furthermore, these various disadvantages increase the overall manufacturing costs.

The present disclosure is directed to cost-effective ICs with embedded capacitors without the need of additional masks, conducive for HV application with a smaller footprint.

SUMMARY

Embodiments of the present disclosure generally relate to a semiconductor device. In one embodiment, a device is disclosed. The device includes a substrate with a capacitor isolation region disposed on a surface of the substrate, and a capacitor disposed on the capacitor isolation region. The capacitor includes a first capacitor control gate stack, a first capacitor sidewall dielectric layer, a capacitor gate, and a control gate electrode. The first capacitor control gate stack includes first and second control gate stack sidewalls. The first capacitor control gate stack includes a hard mask over a control gate, the first capacitor control gate stack serves as an upper portion of a storage gate of memory cell. The first capacitor sidewall dielectric layer is disposed on the first control gate stack sidewall. The capacitor gate includes first and second capacitor gate sidewalls, the capacitor gate is disposed adjacent to the first capacitor control gate stack, the first capacitor gate sidewall abuts the first capacitor sidewall dielectric layer, the capacitor gate serves as an access gate of the memory cell. The control gate electrode of the capacitor control gate stack serves as a first capacitor plate of the capacitor. The capacitor gate serves as a second plate of the capacitor, and the first capacitor sidewall dielectric layer serves as the capacitor dielectric between the first and second capacitor plates.

In another embodiment, a device is disclosed. The device includes a substrate with a capacitor isolation region disposed on a surface of the substrate, and a capacitor disposed on the capacitor isolation region. The capacitor includes a first capacitor electrode layer disposed on the capacitor isolation layer, a capacitor dielectric layer disposed on the first capacitor electrode layer, and a second capacitor electrode layer disposed on the capacitor dielectric layer. The first capacitor electrode layer is a first electrode layer which is used as a first access gate electrode layer of an access gate of a memory cell in a memory region and a logic gate electrode of a logic gate in a logic region. The second capacitor electrode layer is a second electrode layer used as a second access gate electrode layer of the access gate. The capacitor dielectric layer is disposed between the first and second electrode layers in the logic region to serve as a dummy dielectric to facilitate removing the second electrode layer in the logic region.

In another embodiment, a method of forming a device is described. The method includes providing a substrate with a capacitor isolation region disposed on a surface of the substrate, and forming a capacitor on the capacitor isolation region. A first capacitor control gate stack having first and second control gate stack sidewalls is formed. The first capacitor control gate stack includes a hard mask over a control gate, while the first capacitor control gate stack serves as an upper portion of a storage gate of memory cell. A first capacitor sidewall dielectric layer is formed on the first control gate stack sidewall. Furthermore, a capacitor gate having first and second capacitor gate sidewalls is formed adjacent to the first capacitor control gate stack, wherein the first capacitor gate sidewall abuts the first capacitor sidewall dielectric layer, and the capacitor gate serves as an access gate of the memory cell. A control gate electrode of the capacitor control stack serves as a first capacitor plate of the capacitor, the capacitor gate serves as a second plate of the capacitor, and the first capacitor sidewall dielectric layer serves as the capacitor dielectric between the first and second capacitor plates.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 2a-2g show an embodiment of a process for forming a device; and

FIGS. 3a-3c show another embodiment of a process for forming a device.

DETAILED DESCRIPTION

Embodiments of the present disclosure generally relate to devices, for example, semiconductor devices or Integrated Circuits (ICs). More particularly, the ICs generally include NVM ICs embedded with capacitors. The capacitors, for example, are poly-insulator-poly (PIP) capacitors. The capacitors are applicable for high voltage applications, such as 5V. The ICs may be employed for various applications, including RF and mixed signal applications. Other types of applications for the ICs may also be useful. The devices or ICs may be incorporated into or used with, for example, various consumer or commercial products.

Figure 1A:
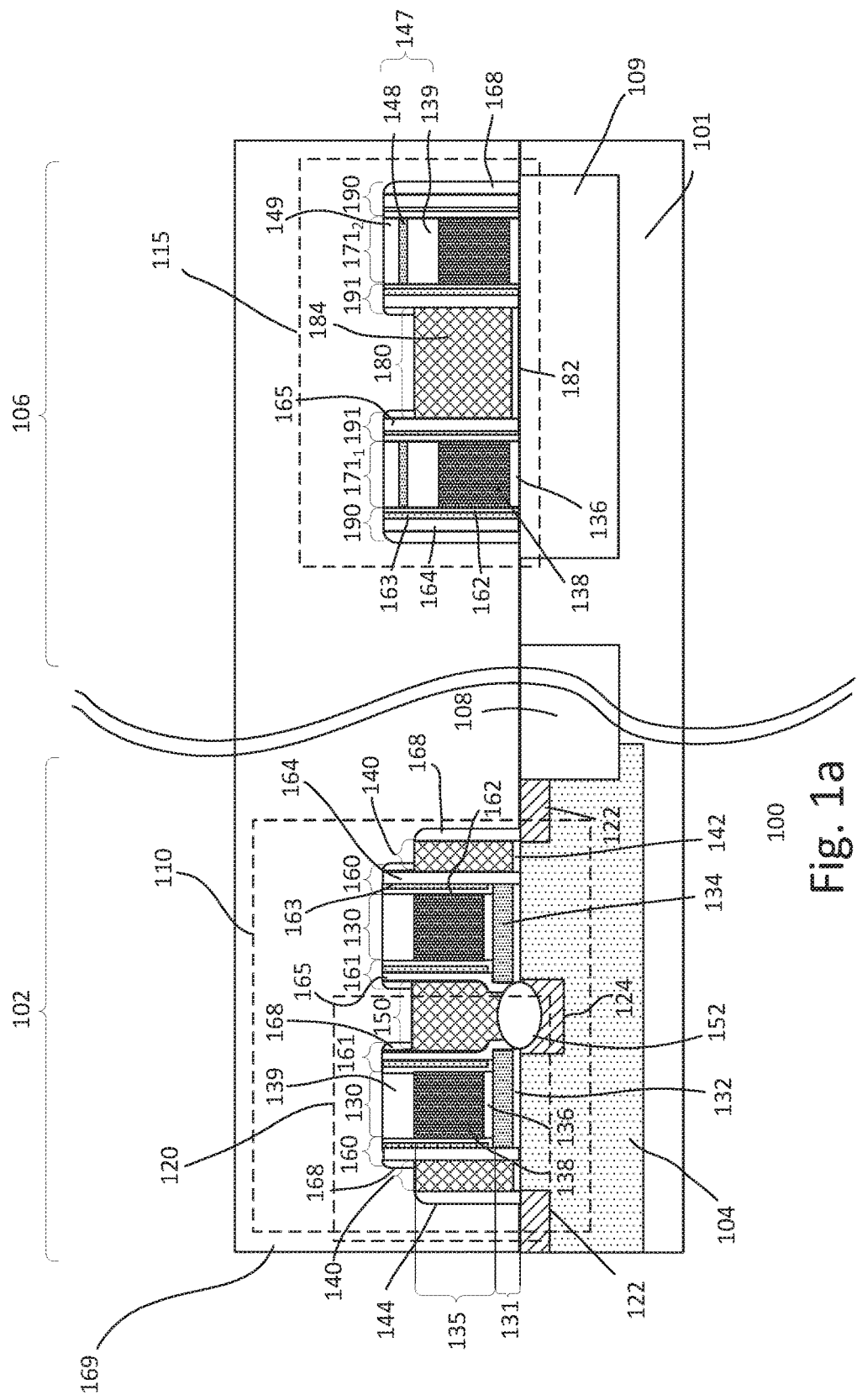
FIGS. 1a-1b show simplified cross-sectional views of embodiments of devices.

FIG. 1a shows a simplified cross-sectional view of an embodiment of a device 100. The device includes a substrate 101. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

The substrate may be prepared with first and second device regions 102 and 106. The first device region, for example, may be a memory region containing memory cells. As shown, the memory region includes a memory cell pair 110 of the device. The memory region can be referred to as an array region. The second region may be a capacitor region with a capacitor 115. It is understood that the memory region may include numerous memory cells and the capacitor region may include additional capacitors. Capacitors may be formed in the same and/or different capacitor isolation regions, depending on the applications. Providing a substrate prepared with other additional types of regions (not shown) may also be useful. For example, the substrate may include a logic region for other types of logic circuitry. The substrate may also include regions for other types of circuitry, depending on the type of device or IC. For example, the logic region may include sub-regions for high voltage (HV), medium voltage (MV) and low voltage (LV) devices.

In one embodiment, the memory cells are NVM memory cells. Providing other types of memory cells may also be useful. The pair of memory cells may be adjacent memory cells of a column of memory cells. The memory cells of the array region may be arranged in columns and rows to form a memory array. The array may be configured to have sub-arrays or sectors.

The array region may include a doped well 104 with dopants of a second polarity type. The doped well may be intermediately or heavily doped. Providing a doped well having other dopant concentrations may also be useful. The doped well may be a common doped well in the array region for the memory cells. In one embodiment, the array well is biased at an array well bias voltage ($V_{bias}$). In one embodiment, $V_{bias}$ is about 0V. The second polarity type doped well serves as a well for a first polarity type memory cells. In one embodiment, the second polarity type is p-type. For example, the p-type doped well serves as a well for an n-type memory cell. Providing an n-type doped well may also be useful. For example, an n-type doped well serves as a well for p-type memory cells. P-type dopants can include boron (B), aluminum (Al), indium (In) or a combination thereof while n-type dopants can include phosphorus (P), arsenic (As), antimony (Sb) or a combination thereof.

The substrate may include device isolation regions 108 to isolate active device regions from other active device regions, as required. For example, isolation regions may be used to isolate rows and columns of memory cells. The isolation regions, for example, are shallow trench isolation (STI) regions. Other types of isolation regions may also be useful.

A memory cell includes a cell transistor with a gate 120. The gate 120, in one embodiment, is a split gate. For example, the split gate includes first and second gates 130 and 140. The split gate is disposed between the first and second source/drain regions 122 and 124. The first S/D region 122 is disposed adjacent to a first side of the split gate and a second S/D region 124 is disposed adjacent to a second side of the split gate.

The first gate 130 may serve as a storage gate. The storage gate includes a control gate 135 disposed on a floating gate 131. A floating gate 131 is disposed on the substrate and includes a floating gate electrode 134 disposed on a floating gate dielectric 132. The floating gate electrode 134 may be polysilicon and the floating gate dielectric 132 may be a thermal oxide. As for the control gate 135, it includes a control gate electrode 138 on a control gate dielectric 136. The control gate electrode 138 may be polysilicon and the control gate dielectric 136 may be an oxide/nitride/oxide (ONO) stack. The control gate dielectric 136 serves as a blocking dielectric for preventing charges stored in the floating gate from permeating into the control gate. A dielectric hard mask layer 139 may be disposed on the storage gate. For example, the hard mask layer 139 is disposed on the control gate 135. The hard mask 139, for example, may be silicon oxide. Other suitable types of hard mask or dielectric materials may also be useful. The hard mask layer 139 may be a remaining lower mask layer of a mask stack having multiple mask layers. The mask stack, for example, may include lower and upper mask layers separated by an etch stop layer.

As shown, a lower portion of the storage gate 130 is wider than an upper portion of the storage gate. The lower portion, in one embodiment, includes the floating gate 131. For example, the lower portion includes the floating gate dielectric 132 and the floating gate electrode 134. The upper portion includes the control gate 135 and the hard mask 139. For example, the upper portion includes the control gate dielectric 136, the control gate electrode 138 and the hard mask 139. In one embodiment, the first upper storage gate sidewall on the second side adjacent to the second S/D region is offset more than the second upper storage gate sidewall on the first side proximate to the first S/D region. Other configurations may also be useful.

An upper sidewall dielectric stack is disposed on sidewalls of the storage gate. For example, first and second upper sidewall dielectric stacks 160 and 161 are formed on first and second upper storage gate sidewalls. An upper sidewall dielectric stack includes first and second upper dielectric sidewall spacers 162 and 163 on the first and second upper storage gate sidewalls 160 and 161. The first upper sidewall spacer 162 may be a high-temperature oxide (HTO) spacer. As for the second upper sidewall spacer 163, it may be a nitride spacer. As shown, the HTO spacer may have an L shape. For example, a bottom of the nitride spacer is disposed on the L shaped HTO spacer. The thickness of the first upper sidewall spacer 162 may be about 100 Å and the thickness of the second upper sidewall spacer 163 may be 150 Å. Other thicknesses may also be useful.

In one embodiment, an outer storage gate dielectric spacer 164 is disposed on the first storage gate sidewall. The storage gate dielectric spacer extends the height of the storage gate. For example, the storage gate dielectric spacer is disposed on upper and lower portion of the first storage gate sidewall. As shown, the storage gate dielectric spacer 164 is disposed on the first upper sidewall dielectric stack and the first side of the floating gate. The outer dielectric sidewall spacer may be an oxide spacer. In one embodiment, the outer dielectric sidewall spacer is a HTO spacer. In one embodiment, the outer sidewall spacer 164 and the first upper sidewall dielectric stack 162 and 163 form a first storage gate sidewall O/N/O stack 160. The thickness of the outer storage gate dielectric spacer may be about 120 Å. Other thicknesses may also be useful.

In one embodiment, a tunneling dielectric layer 165 is disposed on the second storage gate sidewall. The tunneling dielectric layer extends the height of the storage gate. For example, the tunneling dielectric layer is disposed on upper and lower portion of the second storage gate sidewall. As shown, the tunneling dielectric layer 165 is disposed on the first upper sidewall dielectric stack and the second side of the floating gate. The tunneling dielectric layer serves as a second side floating gate dielectric. The tunneling dielectric layer may be an oxide layer. In one embodiment, the tunneling dielectric layer is a HTO layer. The thickness of the tunneling dielectric layer may be about 120 Å. Other thicknesses may also be useful. In one embodiment, the tunneling dielectric layer 165 and the second upper sidewall dielectric stack 162 and 163 form a second storage gate sidewall O/N/O stack 161.

As for the second gate 140, it serves as an access gate. The second gate is disposed on the substrate adjacent to the first side of the storage gate. For example, the second gate is disposed adjacent to the first gate 130 and first S/D region 122. The second or access gate includes an access gate electrode 144 over an access gate dielectric 142. The access gate electrode 144 may be polysilicon and the access gate dielectric 142 may be a thermal oxide. The access gate 140 is isolated from the storage gate 130 by the storage gate dielectric sidewall stack 160.

As for the S/D regions 122 and 124, they are heavily doped first polarity type doped regions. For example, first polarity type doped S/D regions 122 are for first polarity type cell transistors. In one embodiment, the first polarity type is n-type for an n-type cell transistor. Providing p-type S/D regions may also be useful for p-type cell transistors. In one embodiment, the second S/D region 124 serves as a source line of the memory cell. The second S/D region, for example, is a common S/D region for a row of memory cells. The second S/D region 124 may have a different depth from that of the first S/D region 122. The first and second S/D region 122 and 124 may also have different dopant concentrations. For example, the first and second S/D regions may be formed using separate processes.

A third gate 150 is disposed over the second S/D region 124. The third gate serves as an erase gate. The erase gate, for example, may be polysilicon. Other suitable types of gate materials or forming techniques may also be useful. The erase gate 150 is isolated from the second S/D region 124 by an erase gate dielectric 152. The erase gate dielectric 152, for example, may be a thermal oxide layer. Other suitable dielectric materials may also be used as the erase gate dielectric. The thickness of the erase gate dielectric 152 should be sufficient to electrically isolate the erase gate 150 from the second S/D region 124. The erase gate 150 is also isolated from the storage gate 130 by the storage gate sidewall spacer stack 161. The erase gate 150 is separated from the floating gate 131 by the tunneling dielectric layer 165 on the second side of the floating gate.

In one embodiment, the access and erase gates 140 and 150 may include first and second polysilicon layers. For example, the access and erase gates are double polysilicon gates. Other types of the access and erase gates may also be useful. The height of the erase and access gates may be recessed to a height of the top of the control gate. The various gates, such as the storage gate 130, access gate 140 and erase gate 150, may be gate conductors. For example, the gates form common gates for a row of memory cells.

A dielectric access gate spacer 168 may be provided on an exposed first access gate sidewall. The spacer may serve to facilitate forming lightly doped extension and halo regions (not shown) in the first S/D region. The spacer may be spacer stack having multiple dielectric layers. In one embodiment, the access gate sidewall includes a nitride layer over an oxide liner. Other types of spacers may also be useful. The access gate spacer may also be disposed on the exposed storage gate sidewall stack above the erase gate.

In one embodiment, spacers 168 may also be formed on exposed sidewalls of the storage gates above the access and erase gates 140 and 150. The spacers may be oxide spacers. In other embodiments, the spacers may be composite spacers with multiple layers, such as oxide/nitride spacers.

As shown, the cell transistors of a memory cell pair share a common second S/D region. Likewise, the transistors of a memory cell pair share a common erase gate. An erase gate line (EGL) is coupled to the erase gate and a source line (SL) is coupled to the second S/D region. A first wordline ($WL_1$) is coupled to the access gate of the first cell transistor and a first control gate line ($CGL_1$) is coupled to the control gate of the first cell transistor; a second wordline ($WL_2$) is coupled to the access gate of the second cell transistor and a second control gate line ($CGL_2$) is coupled to the control gate of the second cell transistor. As for the first S/D regions of the cell transistors, they are coupled to a common bitline (BL). For example, the cells of the memory cell pair are part of the same column of memory cells. Memory cells may be interconnected by WLs, CGLs, EGLs, SLs and BLs to form a memory array with rows and columns of memory cells.

A dielectric layer 169 is disposed over the memory cell. The dielectric layer, for example, serves as a contact level of an interlevel dielectric (ILD) layer. For example, the dielectric layer serves as a contact level CA of the first ILD level or layer. Contacts (not shown) are formed to the various terminals of the array region. For example, contacts are coupled to the first and second S/D regions, control gates and access gates of the memory cells of the array region. Contact in the CA level may be tungsten contacts. Other types of contacts may also be useful. Conductive lines may be provided in a metal level of the ILD layer above the contact level dielectric layer. For example, conductive lines may be provided in the first metal level M1 of the first ILD layer. Conductive lines in M1 may be copper conductive lines. Contacts and conductive lines in CA and M1 may be formed by single damascene techniques. Additional ILD layers with contact and metal levels are provided. Contacts and conductive lines in the additional ILD layers may be copper contacts and conductive lines formed by, for example, dual damascene techniques.

Lines disposed in the same direction may be provided in the same metal level. Different direction lines are provided in different metal levels. For example, in the case where CGLs, WLs, SLs and EGLs are disposed in a first direction, they may be disposed in the same metal level, such as the first metal level (M1) while BLs which are disposed in a second direction, may be provided in a different metal level, such as the second metal level (M2). Other suitable configurations of conductive lines may also be useful.

As for the capacitor region 106, it includes a capacitor isolation region 109. The capacitor isolation region may be a STI region. For example, the capacitor isolation region may be similar to the device isolation region 108. The capacitor isolation region 109 defines the capacitor region. For example, the capacitor 115 is formed on the capacitor isolation region. The capacitor isolation region may be rectangular in shape. Other shaped capacitor isolation regions may also be useful.

In one embodiment, the capacitor 115 is a polysilicon-insulator-polysilicon (PIP) capacitor. The capacitor includes a first capacitor control gate stack 171$_1$ disposed in the capacitor region on the capacitor isolation region. The control gate stack is similar to the upper portion of a storage gate. For example, the control gate stack 171$_1$ includes a control gate with a control gate electrode 138 disposed on a control gate dielectric 136.

The first control gate stack includes a hard mask stack 147. The hard mask stack may include a lower hard mask layer 139. The lower hard mask layer may be similar to the hard mask 139 on the control gate 135 of the storage gate 130. For example, the lower hard mask layer may be a silicon oxide layer. In addition, the hard mask stack 147 includes an etch stop liner 148 and an upper hard mask layer 149. The etch stop liner 148 may be silicon nitride while the upper hard mask layer 149 may be silicon oxide. Other configurations of hard mask stacks may also be useful.

First and second control gate sidewall dielectric stacks 190 and 191 are disposed on first and second sidewalls of the control gate stack. The first and second control gate sidewall dielectric stacks 190 and 191 are similar to the first and second storage gate sidewall stacks 160 and 161 of the storage gate. For example, the sidewall stacks are formed using the same processes. The first control gate sidewall dielectric stack 190 includes a first dielectric sidewall spacer 162, a second sidewall spacer 163 and an outer dielectric spacer 164. As for the second control gate sidewall dielectric stack 191, it includes a first dielectric sidewall spacer 162, a second sidewall spacer 163 and a side tunnel dielectric layer 165. The thickness of the first dielectric sidewall spacer 190 may be about 100 Å, the thickness of the second dielectric sidewall spacer 191 may be about 150 Å, and the thickness of the side tunnel dielectric layer 165 may be about 120 Å. Other thicknesses may also be useful. The overall thickness of the second sidewall dielectric stack should be sufficient to accommodate HV PIP applications, such as 5V.

A second capacitor gate 180 is disposed in the capacitor region 106 on the capacitor isolation region 109 adjacent to the control gate stack 171$_1$. The second capacitor gate, for example, may be similar to the access gate 140. For example, the second capacitor gate may be formed along with forming the access gate. The second capacitor gate 180 includes a second capacitor gate electrode 184 on a second capacitor gate dielectric 182. A side of the capacitor gate abuts one of the sidewall dielectric stacks of the control gate stack. For example, a side of the capacitor gate abuts the second sidewall dielectric stack of the first control gate stack 171$_1$.

The control gate electrode 138 may serve as a first capacitor plate, such as the bottom capacitor plate, while second capacitor gate electrode 184 serves as the second capacitor plate, such as the top capacitor plate. The second sidewall dielectric stack 191 serves as a capacitor dielectric between the capacitor plates.

As shown, the capacitor region 106 includes a second control gate stack 171$_2$. The second control gate stack is similar to the first control gate stack 171$_1$. The capacitor gate 180 is disposed between the first and second gate stacks 171$_1$ and 171$_2$. For example, sides of the capacitor gate 180 abut the second sidewall dielectric stacks 191 of the control gate stacks 171$_1$ and 171$_2$. In one embodiment, the second capacitor gate electrode 184 serves as a common terminal for first and second capacitors. Contacts may be formed in the dielectric layer 169 to the different capacitor plates. For example, contacts may be formed in a contact level of the first ILD level or layer. Conductive lines may be provided in a metal level of the ILD layer above the contact level dielectric layer to provide the desired connections to the capacitor.

Figure 1B:
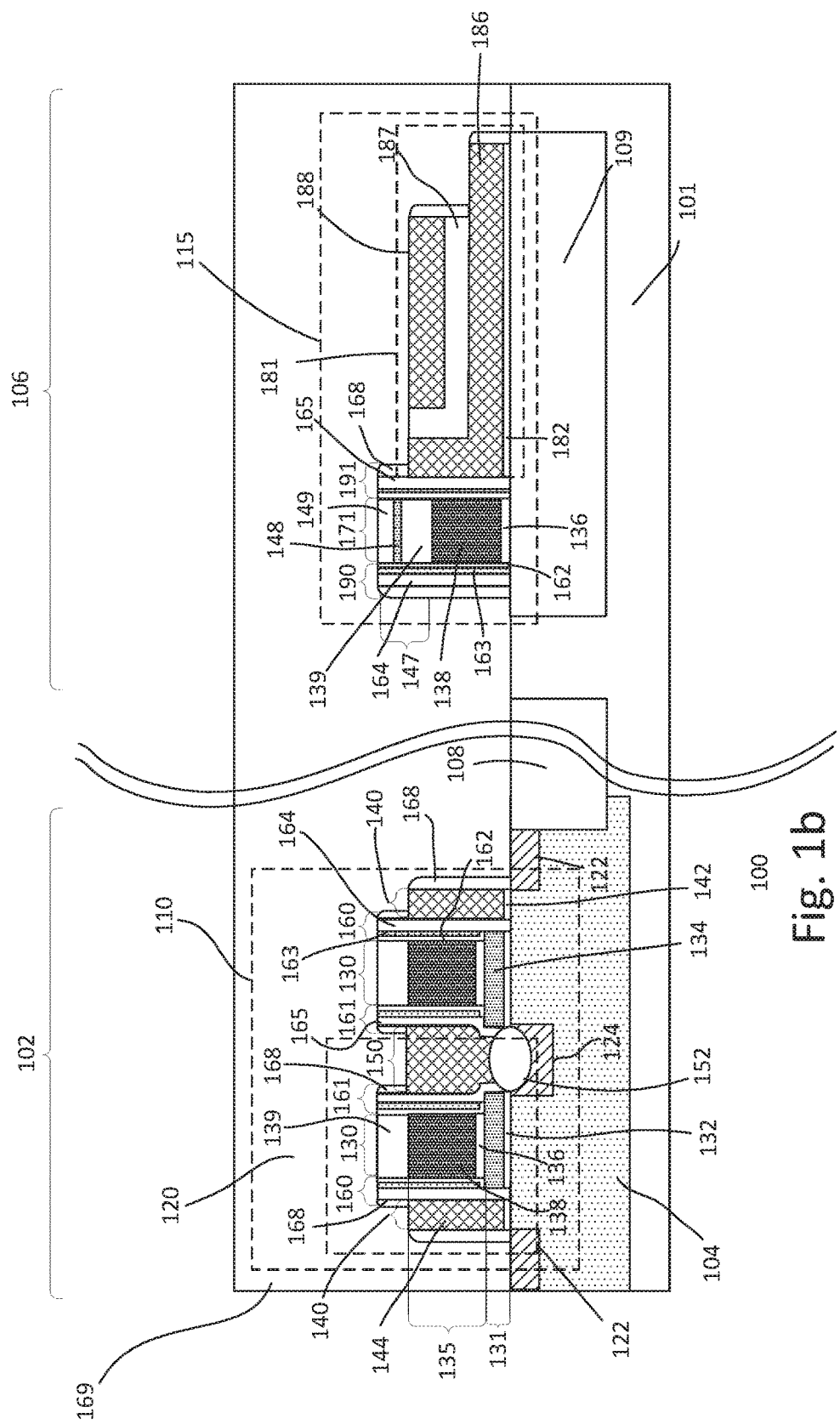

FIG. 1b shows a simplified cross-sectional view of an embodiment of a device 100. The device is similar to the device of FIG. 1a. Common elements may not be described or described in detail.

The device includes a substrate 101. The substrate, for example, may be a silicon substrate. The substrate may be prepared with first and second device regions 102 and 106. The first device region, for example, may be a memory region containing memory cells. As shown, the memory region includes a memory cell pair 110 of the device. The memory region can be referred to as an array region. The second region may be a capacitor region with a capacitor 115.

In one embodiment, the memory cells are NVM memory cells, such as split gate NVM cells which are described in FIG. 1a. Providing other types of memory cells may also be useful. The pair of memory cells may be adjacent memory cells of a column of memory cells. The memory cells of the array region may be arranged in columns and rows to form a memory array. The array may be configured to have sub-arrays or sectors.

As for the capacitor region, it includes a capacitor isolation region 109. The capacitor isolation region may be a STI region. The capacitor isolation region defines the capacitor region. For example, the capacitor 115 is formed on the capacitor isolation region 109. The capacitor isolation region may be rectangular in shape. Other shaped capacitor isolation regions may also be useful.

In one embodiment, the capacitor is a polysilicon-insulator-polysilicon (PIP) capacitor. The capacitor includes a control gate stack 171 disposed in the capacitor region 106 on the capacitor isolation region 109. In one embodiment, the control gate stack 171 may be similar to that described in FIG. 1a. In another embodiment, there is no control gate stack 171 disposed in the capacitor region 106.

A double poly stack 181 is disposed adjacent to the control gate stack 171. The poly stack includes first and second poly layers 186 and 188. The poly layers, in one embodiment, are the double poly layers of the access and erase gates. The first and second poly layers are separated by a capacitor dielectric layer 187. The first poly layer 186 serves as the bottom capacitor plate and the second poly layer 188 serves as the top capacitor plate.

The capacitor dielectric layer 187 may be silicon oxide. Other types of capacitor dielectrics, including dielectric stacks, may also be useful. The capacitor dielectric can be tuned to achieve the desired capacitance and voltage tolerance. For example, the thickness of the capacitor dielectric can be tuned for HV PIP applications, such as 5V. Tuning the capacitor dielectric for other voltages as well as capacitances may also be useful.

The capacitor dielectric 139 is disposed over the first poly layer 138. The second poly layer 148 is disposed over the capacitor dielectric layer 139. The second poly layer 148, as shown, is a poly layer disposed on the capacitor dielectric layer. The second poly plate is patterned to include an offset to expose the first poly layer, enabling contacts to the first poly layer. In one embodiment, the capacitor dielectric may be a dummy dielectric layer disposed between the first and second poly layers. The dummy dielectric layer, for example, serves as an etch stop for removing the second poly layer in the logic region.

Contacts may be formed in the dielectric layer 169 to the different plates of the capacitor. For example, contacts may be formed in a contact level of the first ILD level or layer. Conductive lines may be provided in a metal level of the ILD layer above the contact level dielectric layer to provide the desired connections to the capacitor.

FIGS. 2a-2g show cross-sectional views of an embodiment of a process for forming a device 200. The device, for example, is similar to that described in FIGS. 1a-1b. Common elements may not be described or described in detail.

Referring to FIG. 2a, a substrate 101 is provided. The substrate, in one embodiment, is a silicon substrate. The substrate, for example, may be a semiconductor substrate, such as a silicon substrate. Other types of substrates or wafers may also be useful. For example, the substrate may be a silicon germanium, germanium, a gallium arsenide, or a crystal-on-insulator (COI) such as silicon-on-insulator (SOI) substrate. The substrate maybe a doped substrate. For example, the substrate can be lightly doped with p-type dopants. Providing a substrate with other types of dopants or dopant concentrations as well as an undoped substrate, may also be useful.

The substrate is prepared with first and second device regions 102 and 106. The first device region, for example, may be a memory or array region. As for the second region, it may be a capacitor region. Other types of device regions, such as logic regions for logic transistors, including LV, MV and HV transistors, may also be included in the device.

Device and capacitor isolation regions are formed in the first and second device regions. The device isolation regions, for example, are STI regions. Other types of isolation regions may also be formed. A STI region surrounds a device region. For example, a device isolation region 108 surrounds the device region 102. In the case of the array region, it may be configured to isolate memory cell pairs in column and row direction. Other configurations of device isolation regions may also be useful.

As for the capacitor isolation region 109, it defines the capacitor region 106. Various processes can be employed to form the STI regions. In one embodiment, the substrate can be etched using mask and etch techniques to form isolation trenches. For example, a resist mask is patterned by exposing it with an exposure source through a reticle containing the desired pattern. The pattern of the reticle is transferred to the resist mask after its development. To improve lithographic resolution, an antireflective coating (ARC) may be provided below the resist mask. An anisotropic etch, such as a reactive ion etch (RIE) etches the substrate, forming the isolation trenches. The trenches are then filled with a dielectric material, such as silicon oxide. The oxide may be formed by chemical vapor deposition (CVD). A chemical mechanical polish (CMP) may be performed to remove excess oxide and provide a planar substrate top surface. Other processes or materials can also be used to form the STIs. The depth of the STIs, for example, is about 3000-5000 Å. Other depths for the STIs may also be useful.

A doped well 104 is formed in the array region. In one embodiment, the doped well includes second polarity type dopants for a first polarity type NVM cells. The doped well may be a lightly or intermediately doped second polarity type doped well. The doped well may have a depth which is deeper than the bottom of the isolation region. The doped well may be formed by implanting second polarity type dopants. An implant mask may be used to implant the second polarity type dopants. For example, the implant mask exposed the cell region in which dopants are to be implanted. An anneal is performed after forming the device wells. The anneal activates the dopants.

As described, the process is used for preparing the cell region. Preparing other device regions, such as LV, MV and HV device regions may also be useful. Isolation regions may be formed to isolate different regions. Implants may be performed to form the device wells. Separate implant processes may be employed to form differently doped or different types of device wells.

In some embodiments, deep isolation wells (not shown) may be provided. The deep isolation wells serve to isolate the device doped wells from the substrate. The deep isolation wells, for example, have a depth greater than the device doped wells. The deep isolation wells may have dopants of opposite polarity type than the device wells which they isolate.

As shown, the substrate is prepared with lower portions of storage gate stack layers. In one embodiment, the substrate is prepared with layers of the floating gate 131. For example, a floating gate dielectric and electrode layers 132 and 134 are formed on the substrate. The floating gate dielectric may be an oxide layer formed by thermal oxidation and the floating gate electrode may be a polysilicon layer formed by CVD. Other types of layers or forming techniques may also be useful.

In one embodiment, the floating gate layers 131 are patterned to remove them from the capacitor regions as well as other device regions. In some cases, the layers may remain in the logic regions, such as the HV, MV and LV regions. Patterning the floating gate layers may be achieved using mask and etch techniques. For example, a patterned resist mask may be provided on the substrate, exposing portions of the floating gate layers to be removed. An anisotropic etch, such as RIE, etches floating gate layers exposed by the resist mask. After patterning the layers, the resist mask is removed by, for example, ashing.

Figure 2B:
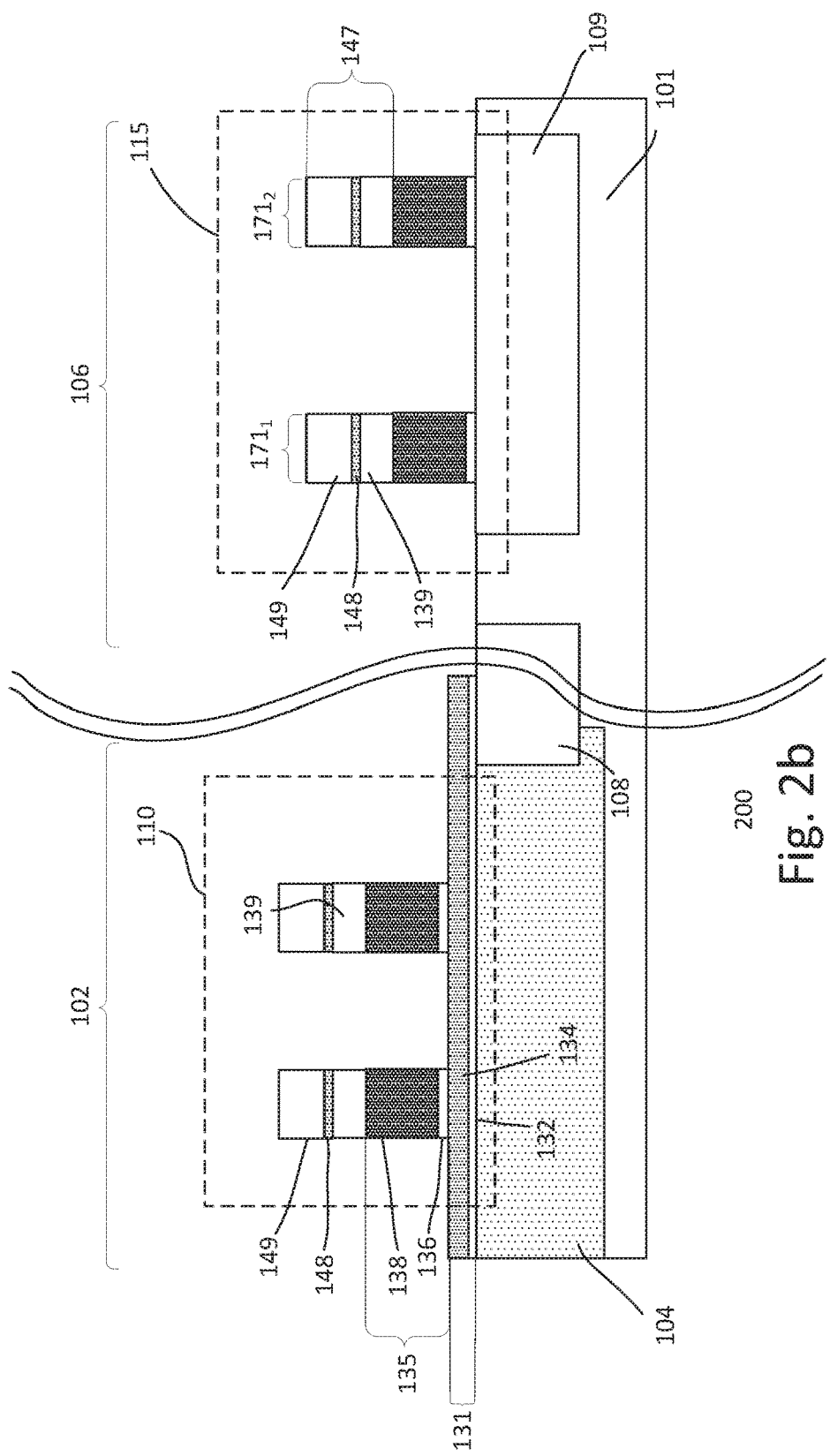

Referring to FIG. 2b, upper portion gate stack layers are formed on the substrate. The upper portion storage gate stack layers include layers of the control gate 135 and the hard mask stack 147. In one embodiment, the control gate layers 135 include control gate dielectric and electrode layers 136 and 138. The control gate dielectric layer 136 may be an ONO stack and the control gate electrode 138 may be a polysilicon layer. The layers of the control stack may be formed by CVD. Other types of layers or forming techniques may also be useful.

As for the hard mask stack 147, it includes a lower mask layer 139, an etch stop layer 148 and an upper mask layer 149. The mask layers may be oxide layers and the etch stop layer may be a nitride layer. The layers of the hard mask stack may be formed by CVD. Other types of layers or forming techniques may also be useful.

The upper portion gate stack layers are patterned to form upper portion gate stacks for the memory cells 110 in the memory region and capacitor control gate stacks $171_{1-2}$ in the capacitor region. Patterning the upper portion gate stack layers may be achieved using mask and etch techniques. For example, a patterned resist mask may be provided on the substrate, exposing portions of the control gate and hard mask stack layers to be removed. An anisotropic etch, such as RIE, etches the control gate and hard mask stack layers exposed by the resist mask. After patterning the layers, the resist mask is removed by, for example, ashing.

Figure 2C:
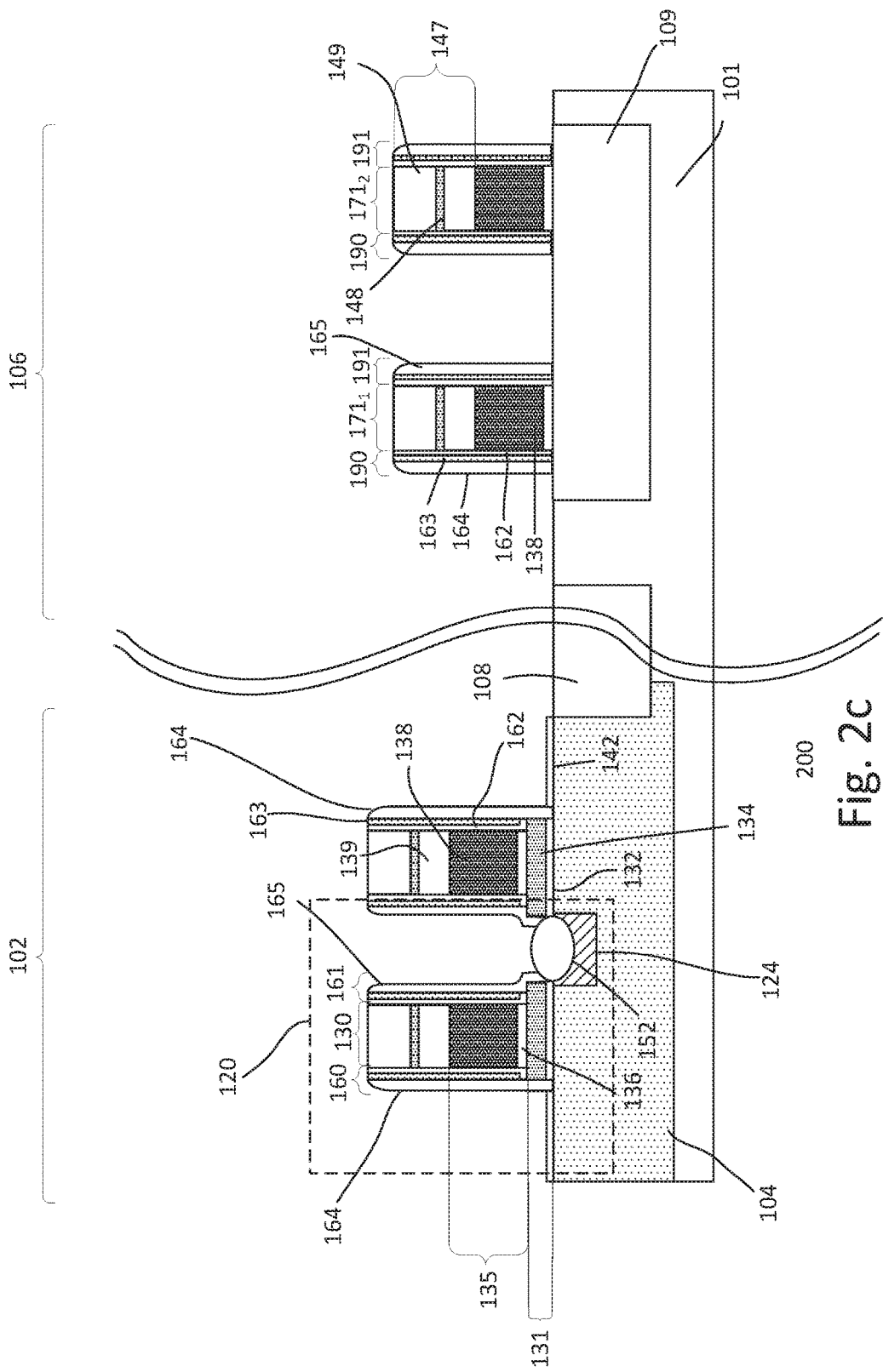

In FIG. 2c, the process continues to form first and second upper storage gate stacks 160 and 161 on first and second sidewalls of the storage gates 130 and first and second control gate sidewall stacks 190 and 191 on first and second sidewalls of the capacitor control gate stacks 171₁ and 171₂. Various techniques may be employed to form the various layers of the sidewall stacks. In one embodiment, the sidewall stacks of the storage and capacitor control gates are formed in the same process flow of module.

In one embodiment, first and second upper sidewall spacers 162 and 163 are formed on the upper portion of the storage gate stacks and capacitor control gate stacks. At this stage of processing, the lower floating gate layers 131 remain unpatterned in the array region. The first sidewall spacers may be HTO spacers and the second sidewall spacers may be nitride spacers. To form the spacers, an HTO spacer layer is formed on the substrate. The HTO spacer layer may be formed by CVD followed by an anneal. A nitride spacer layer is formed over the HTO spacer layer by CVD. The first and second sidewall spacer layers are anisotropically etched by, for example, an RIE. The etch removes horizontal portions of the spacer layers, leaving HTO and nitride spacers on sidewalls of the upper portion of the storage gate stacks and control gate stacks.

After forming the first and second sidewall spacers 162 and 163, sacrificial spacers may be formed over the first and second sidewall spacers. In one embodiment, the sacrificial spacers are oxide sacrificial spacers. For example, an oxide sacrificial spacer layer is formed on the substrate by CVD followed by a spacer etch to form sacrificial spacers on the second sidewall spacers.

In one embodiment, the sacrificial spacers on the first sidewalls of the upper portions of the storage gate stacks are removed. The process may also remove sacrificial spacers on second sidewalls of the capacitor control gate stacks. In one embodiment, prior to removing the sacrificial spacers, a gate threshold voltage (Vt) implant may be performed for the access gate. For example, dopants are implanted through the floating gate using an implant mask to adjust the Vt of the access gate. The implant mask may also serve to remove the sacrificial spacers on first sidewalls of the upper portion of the storage gate. The sacrificial spacers may be removed by a wet etch. After removal of the sacrificial spacers, the resist mask is removed by, for example, ashing.

In one embodiment, the floating gate layers 131 are patterned to form lower portions of the storage stack. For example, the floating gate layers are patterned to form floating gates below the control gates. Forming the floating gates is achieved using mask and etch techniques. In one embodiment, the floating gates are self-aligned to the remaining spacers. For example, the resist etch mask only expose the array region. Within the array region, the etch removes exposed portions of the floating gate layers selective to the remaining sidewall spacers. Due to the remaining sacrificial spacers on second sidewalls of the upper portions of the storage gates, the second sides of the control gates are offset greater than the first sides. In the case of the logic regions which include floating gate layers, they are also removed. This exposes the logic device regions.

After patterning floating gate layers, sidewall spacers 164 are formed on the gate stacks. In one embodiment, the sidewall spacers are HTO spacers. For example, an oxide layer is formed on the substrate by CVD followed by an anneal to form the HTO spacer layer. The HTO spacer layer is patterned by a spacer etch, such as RIE, to form the HTO spacers.

As discussed, the device may include logic regions with logic transistors, such as HV, MV and LV transistors. At this stage of processing, the gate oxides of the HV transistors are formed. In one embodiment, the HV gate oxide is a combination of thermal and HTO oxide. The thermal oxide is formed on the logic regions while the HTO oxide is a blanket oxide which covers the substrate, including the array region.

The process may continue to form the second S/D region 124. An implant is performed using an implant mask. For example, the implant exposes a region of the substrate where the second S/D region is to be formed. In one embodiment, the implant mask exposes the second sides of the storage gates where the second S/D region is to be formed. An etch removes the HV oxide and HTO sidewall spacers on the second sidewalls of the storage gates. The etch, for example, is a wet etch using the implant mask. This leaves the second upper sidewall spacers and second sides of the floating gates exposed. The HTO sidewall spacers 164 on the first sidewalls of the storage gates remain. After etching, the resist mask is removed by, for example, ashing.

A side tunneling dielectric oxide layer 165 is formed on the second sidewalls of the storage gates. The side tunneling layer, in one embodiment, is a HTO layer. For example, an oxide layer is formed on the substrate followed by an anneal. After forming the tunneling oxide layer, it is patterned, leaving it on second sidewalls of the storage gates and over the second S/D region. For example, the etch removes the tunneling oxide over the access gate and first S/D region. The etch may also remove the tunneling oxide in the MV and LV logic regions.

At this stage of processing, a portion of MV gate oxide may be formed in the logic regions. In one embodiment, the substrate is oxidized to form gate oxide in the logic regions. This forms an erase gate oxide, an oxide over the access gate and first S/D region, increases the thickness of the HV oxide, a portion of the MV oxide and an oxide over the LV region.

The process continues to form the access gate oxide 142. Forming the access gate oxide may also form the oxide for the LV logic region as well as completing the HV and MV oxides. In one embodiment, the oxides over the access gate and LV regions are removed. For example, a wet etch using a resist mask exposing the access gate and LV regions are performed. After the etch, the resist mask is removed by, for example, ashing. A thermal oxidation, such as rapid thermal oxidation (RTO) is performed to form the access gate and LV oxides as well completing the HV and MV oxides.

Referring to FIG. 2d, a first gate electrode layer 247 is formed on the substrate. The first gate electrode layer, for example, is a polysilicon layer formed by CVD. The first gate electrode layer may be referred to as a logic gate electrode layer. The thickness of the first gate electrode has a thickness equal to the thickness of the logic gate electrodes. The first gate electrode layer, as shown, is insufficient to fill gaps between the gate stacks of the memory and capacitor regions. The thickness, for example, may be about 800-1000 Å. Other thicknesses may also be useful.

In FIG. 2e, the process continues. A cap dielectric layer may be formed over the first gate electrode layer. The cap dielectric layer, for example, may be an oxide layer formed by CVD. The thickness of the cap dielectric layer may be about 200-500 Å. Other thicknesses or types of cap dielectric layer may also be useful. The cap dielectric layer is patterned, removing it from the memory and capacitor regions, leaving it remaining in the logic regions.

A second gate electrode layer 248 is formed on the substrate. The second electrode layer fills the gaps and covers the gate stacks in the memory and capacitor regions while separated from the first gate electrode layer in the logic regions. The substrate is planarized. For example, the substrate is planarized by CMP. As shown, the CMP recesses the top surface of the electrode layers to be coplanar with the storage gate stacks.

Figure 2F:
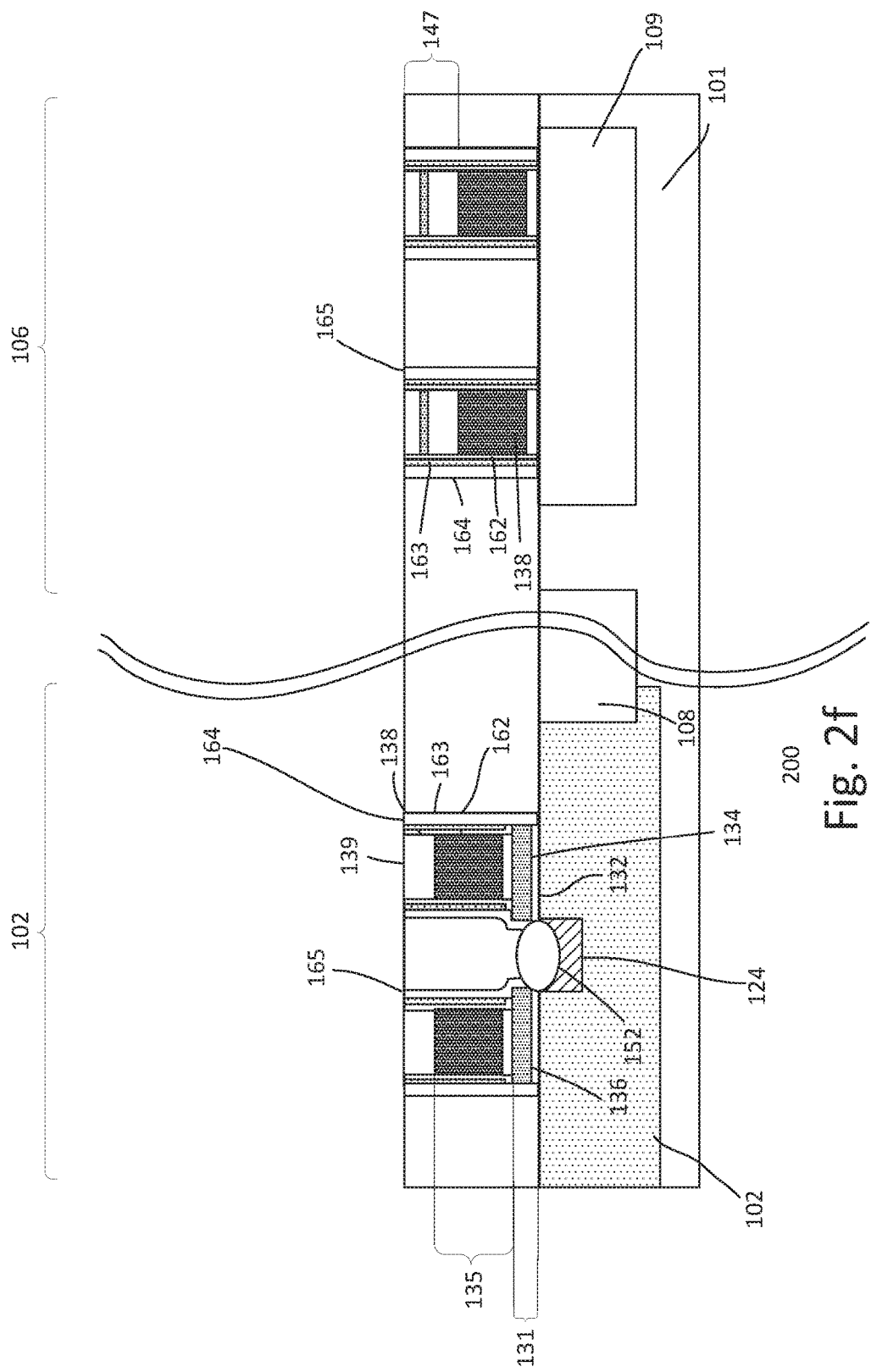

The planarization process continues, as shown in FIG. 2f, to further reduce the height of the gate electrode layers to produce a planar surface with the capacitor control gate stacks. The CMP, for example, stops at the lower mask layer of the storage gate stack. This removes the upper mask and etch stop layers over the storage gate stack.

Figure 2G:
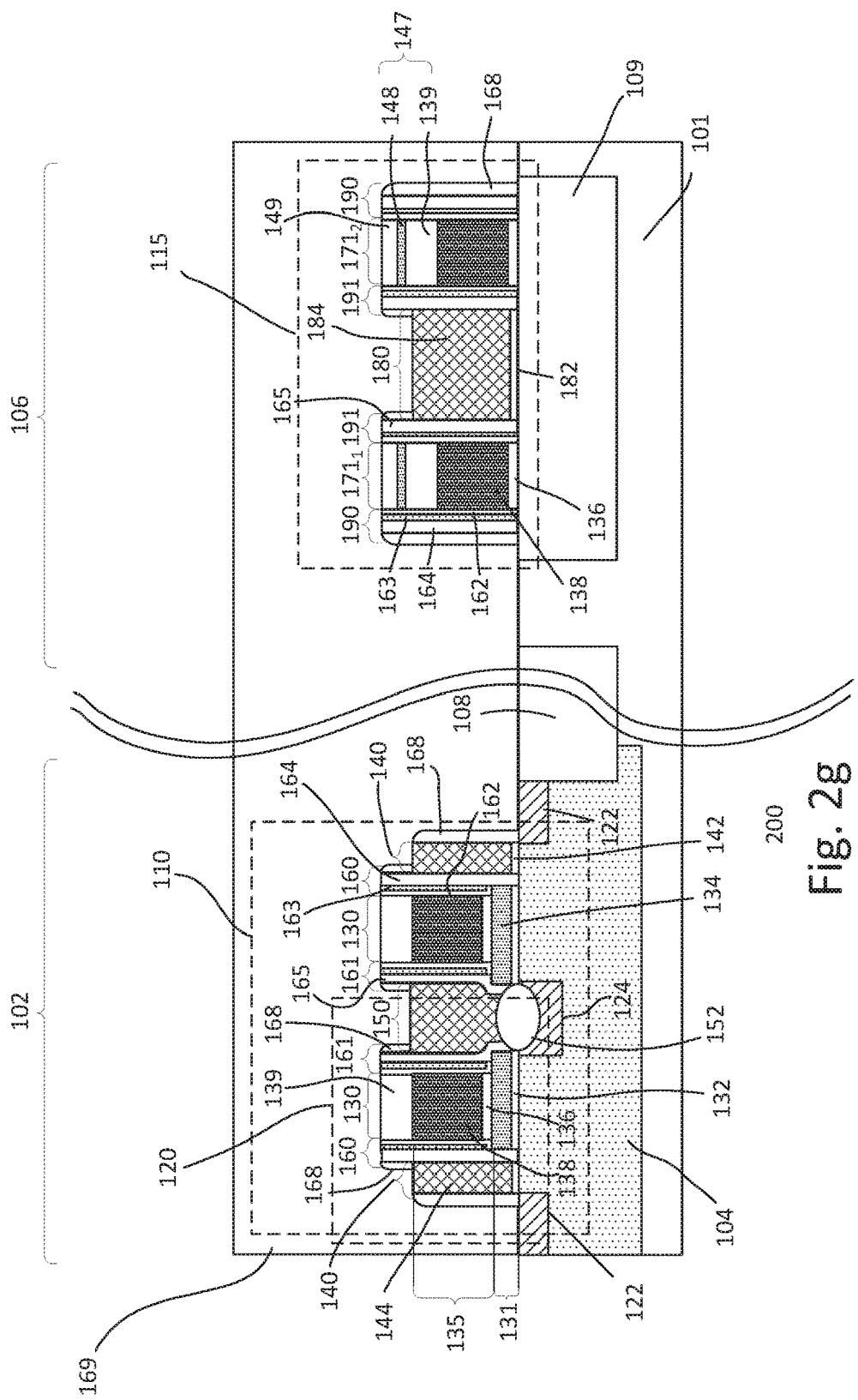

Referring to FIG. 2g, an etch back process is performed to recess the top of the gate electrode layers below the top of the gate stacks. The etch back process, for example, is an RIE selective to oxide and nitride. In one embodiment, the etch back reduces the height of the gate electrode layers to about the top the control gate electrode of the storage stacks. Reducing the gate electrode layers to other heights may also be useful. This forms an erase gate 150 between two adjacent storage gates of a memory cell pair 110. The cap oxide in the logic regions may also be removed.

The recessed gate electrode layers are patterned, forming access gates 140 in the memory region. Patterning the electrode layer may also remove gate electrode material outside of the capacitor region as well as forming gates in the logic regions.

The process may continue to form first S/D regions 122 in the memory region. Forming the first S/D regions may also include forming lightly doped extension regions. To form the lightly doped extension regions, a first polarity type lightly doped extension implant is performed. The lightly doped extension regions extend slightly under the access gates. Lightly doped extension regions may also be formed for first polarity type logic transistors. After the extension regions are formed, the implant mask is removed. Separate second polarity type lightly doped extension regions may be performed for second polarity type logic transistors.

Dielectric offset spacers 168 may be formed on exposed sidewalls of the access gates. Offset spacers may also be formed on the exposed sidewalls of the storage gates above the access and erase gates as well as exposed capacitor control gate sidewalls. The offset spacers may be oxide spacers. In other embodiments, the offset spacers may be composite spacers with multiple layers, such as oxide/nitride spacers. To form the offset spacers, an offset spacer layer is formed on the substrate. A spacer etch, such as RIE, is performed, forming the offset spacers.

A first polarity type S/D implant is performed using a S/D implant mask. The implant forms first S/D regions adjacent to the access gates. The S/D implant may also form first polarity type well or substrate contacts. After forming the S/D regions, the implant mask is removed by, for example, ashing. A separate second polarity type S/D implant may be performed to form second polarity type S/D regions for second polarity type logic transistors and second polarity type substrate contacts.

A dielectric layer 169 may be formed on the substrate. The dielectric layer covers the gates and substrate. The dielectric layer may be a silicon oxide layer formed by CVD. The dielectric layer serves as a contact level of an interlevel dielectric (ILD) layer. For example, the dielectric layer serves as a contact level CA of the first ILD level or layer. Contacts (not shown) are formed to the various terminals in various device regions. For example, contacts may be formed to various terminals in the array, capacitor and logic regions of the device. Terminals may include gates, such as control gate electrodes, access gate electrodes and logic gate electrodes, S/D regions, substrate contacts and capacitor plates. Other types of terminals may also be included. Contact in the CA level may be tungsten contacts. Other types of contacts may also be useful. The contacts may be formed using single damascene techniques. For example, contact vias in the dielectric layer by etch and mask techniques to expose terminal regions. Conductive material of the contacts, such as tungsten, is deposited on the substrate to fill the vias. A polishing process, such CMP, may be employed to remove excess conductive material to form the contacts.

Conductive lines may be provided in a metal level of the ILD layer above the contact level dielectric layer. For example, conductive lines may be provided in the first metal level M1 of the first ILD layer. Conductive lines in M1 may be copper conductive lines. Contacts and conductive lines in CA and M1 may be formed by single damascene techniques.

Additional ILD layers with contact and metal levels are provided. Contacts and conductive lines in the additional ILD layers may be copper contacts and conductive lines formed by, for example, dual damascene techniques. Other techniques for forming additional ILD layers may also be useful.

Lines disposed in the same direction may be provided in the same metal level. Different direction lines are provided in different metal levels. For example, in the case where CGLs, WLs, SLs and EGLs are disposed in a first direction, they may be disposed in the same metal level, such as the first metal level (M1) while BLs which are disposed in a second direction, may be provided in a different metal level, such as the second metal level (M2). ILD levels may be provided for power lines and ground lines. In addition, a pad level with contact pads is provided above the uppermost ILD level. The pad level provides external connections to the device. Other configurations of ILD levels may also be useful.

As described, integrating the capacitor into the device with memory cells, such as split gate NVM cells, can be easily achieved. The embodiment described in FIGS. 1a and 2a-2g enables the integration of the capacitor without any additional masks required. Only modification of the masks is needed. In addition, increased density can be achieved since the capacitor is formed on a capacitor isolation region, eliminating noise concerns from the substrate. The various advantages reduce the manufacturing costs.

Figure 3C:
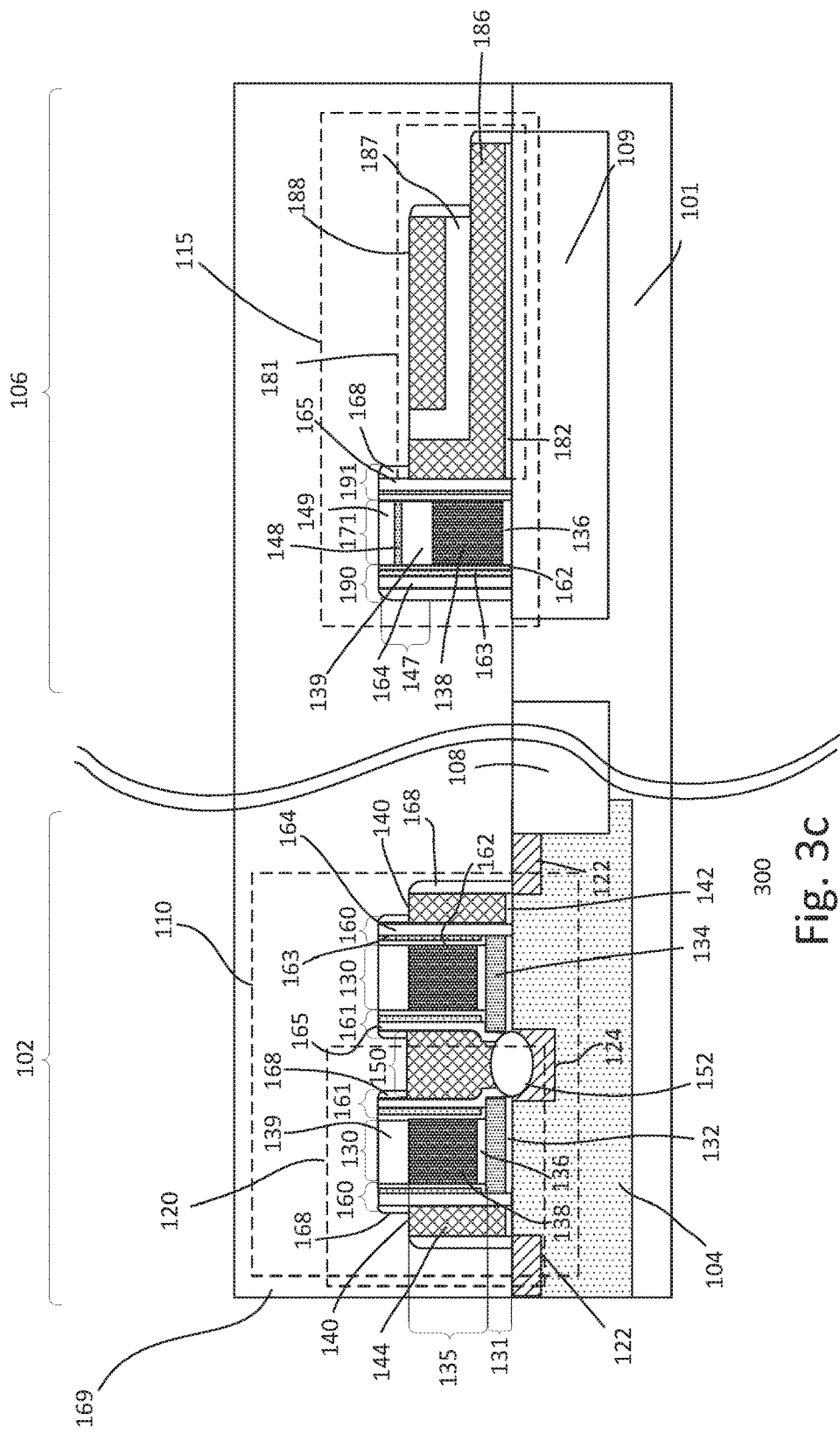

FIGS. 3a-3c show cross-sectional views of another embodiment of a process for forming a device 300. The process and device, for example, is similar to that described in FIGS. 1a-1b and 2a-2g. Common elements may not be described or described in detail.

Referring to FIG. 3a, the device is at a similar stage of processing as described in FIG. 2d. For example, storage gates with first and second storage gate sidewall stacks 160 and 161 are formed in the array region 102. A source region 124 is disposed between adjacent storage gate stacks of a memory cell pair. Above the source region is an erase gate dielectric 152. In one embodiment, a capacitor control gate stack 171 with first and second and first and second control gate sidewall stacks 190 and 191 is formed in the capacitor region 106. For example, unlike the embodiment described in FIG. 2d, only one control gate stack is formed for a capacitor 115 in the capacitor region. A first gate electrode layer 247 is formed on the substrate 101.

Referring to FIG. 3b, the process continues. As shown, the first gate electrode layer serves as a bottom capacitor plate 186 in the capacitor region. For example, the thickness of the first gate electrode layer defines a thickness of the logic gate as well as the bottom capacitor plate.

In one embodiment, a cap dielectric layer may be formed over the first gate electrode layer. The cap dielectric layer serves as an etch stop in the logic regions. In one embodiment, the cap dielectric layer is an oxide layer. For example, the cap dielectric layer may be a chemical vapor deposition (CVD) deposited oxide layer. Other types of cap dielectric layers may also be useful, including a cap dielectric stack having multiple dielectric layers.

The cap dielectric layer also serves as a capacitor dielectric 187. For example, the thickness of the cap dielectric layer may be tailored to tune the capacitance of a capacitor 115 in the capacitor region. The thickness of the cap dielectric may be about 200-500 Å. Other thicknesses or types of cap dielectric layer may also be useful, depending on the desired capacitance and dielectric material. In one embodiment, the cap dielectric layer is patterned, removing it from the memory region, leaving it remaining in the capacitor and logic regions.

A second gate electrode layer 188 is formed on the substrate. The second gate electrode layer may be a polysilicon layer formed by CVD. Other types of gate electrode layers may also be useful. The second electrode layer fills the gaps and covers the gate stacks in the memory and capacitor regions. The second gate electrode layer is separated from the first gate electrode layer in the capacitor and logic regions.

The substrate is processed, similar to that described in FIGS. 2e-2g. For example, the substrate is planarized by chemical mechanical polishing (CMP). The CMP recesses the top surface of the electrode layers to be coplanar with the capacitor control gate stack. The CMP, for example, stops at the lower mask layer of the storage gate stack. This removes the upper mask and etch stop layers over the storage gate stack.

An etch back process is performed to recess the top of the gate electrode layers below the top of the gate stacks. In one embodiment, the etch back reduces the height of the gate electrode layers to about the top of the control gate electrode. Reducing the gate electrode layers to other heights may also be useful. This forms an erase gate 150 between two adjacent storage gates of a memory cell pair 110. The cap oxide in the logic regions may also be removed.

The recessed gate electrode layers are patterned, forming access gates 140 in the memory region. Patterning the electrode layers also forms the capacitor 115 in the capacitor region. For example, the capacitor includes bottom and top capacitor plates 186 and 188 separated by the capacitor dielectric 187. Patterning the electrode layers may also remove gate electrode material outside of the capacitor region as well as forming gates in the logic regions.

In FIG. 3c, the top capacitor plate 188 is patterned to provide an offset to expose the bottom capacitor plate. This enables connection to the bottom capacitor plate 186. The top capacitor plate may be patterned by mask and etch techniques during the etch back process. For example, an resist etch mask may be provided which exposes portions of the top capacitor electrode layer to be removed by an etch, such as reactive ion etching (RIE).

After patterning the top capacitor plate, the process may continue to form first S/D regions 122 in the memory region. Forming the first S/D regions may also include forming lightly doped extension regions. To form the lightly doped extension regions, a first polarity type lightly doped extension implant is performed. The lightly doped extension regions extend slightly under the access gates. Lightly doped extension regions may also be formed for first polarity type logic transistors. After the extension regions are formed, the implant mask is removed. Separate second polarity type lightly doped extension regions may be formed for second polarity type logic transistors.

A first polarity type S/D implant is performed using a S/D implant mask. The implant forms first S/D regions adjacent to the access gates. The S/D implant may also form first polarity type well or substrate contacts. After forming the S/D regions, the implant mask is removed by, for example, ashing. A separate second polarity type S/D implant may be performed to form second polarity type S/D regions for second polarity type logic transistors and second polarity type substrate contacts.

A dielectric layer 169 may be formed on the substrate. The dielectric layer covers the gates and substrate. The dielectric layer may be a silicon oxide layer formed by CVD. The dielectric layer serves as a contact level of an interlevel dielectric (ILD) layer. For example, the dielectric layer serves as a contact level CA of the first ILD level or layer. Contacts (not shown) are formed to the various terminals in various device regions. For example, contacts may be formed to various terminals in the array, capacitor and logic regions of the device. Terminals may include gates, such as control gate electrodes, access gate electrodes and logic gate electrodes, S/D regions, substrate contacts and capacitor plates. Other types of terminals may also be included. Contact in the CA level may be tungsten contacts. Other types of contacts may also be useful. The contacts may be formed using single damascene techniques. For example, contact vias in the dielectric layer by etch and mask techniques to expose terminal regions. Conductive material of the contacts, such as tungsten, is deposited on the substrate to fill the vias. A polishing process, such CMP, may be employed to remove excess conductive material to form the contacts.

Conductive lines may be provided in a metal level of the ILD layer above the contact level dielectric layer. For example, conductive lines may be provided in the first metal level M1 of the first ILD layer. Conductive lines in M1 may be copper conductive lines. Contacts and conductive lines in CA and M1 may be formed by single damascene techniques.

Additional ILD layers with contact and metal levels are provided. Contacts and conductive lines in the additional ILD layers may be copper contacts and conductive lines formed by, for example, dual damascene techniques. Other techniques for forming additional ILD layers may also be useful.

Lines disposed in the same direction may be provided in the same metal level. Different direction lines are provided in different metal levels. For example, in the case where CGLs, WLs, SLs and EGLs are disposed in a first direction, they may be disposed in the same metal level, such as the first metal level (M1) while BLs which are disposed in a second direction, may be provided in a different metal level, such as the second metal level (M2). ILD levels may be provided for power lines and ground lines. In addition, a pad level with contact pads is provided above the uppermost ILD level. The pad level provides external connections to the device. Other configurations of ILD levels may also be useful.

As described, integrating the capacitor into the device with memory cells, such as split gate NVM cells, can be easily achieved. The embodiment described in FIGS. 1b and 3a-3c enable the integration of the capacitor with only one additional mask. For example, an additional mask is provided for patterning the top capacitor plate. In addition, increased density can be achieved since the capacitor is formed on a capacitor isolation region, eliminating noise concerns from the substrate. The various advantages reduce manufacturing costs.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

The invention claimed is:

1. A device comprising:
a substrate with a capacitor isolation region disposed on a surface of the substrate; and
a capacitor disposed on the capacitor isolation region, wherein the capacitor comprises,
a first capacitor control gate stack having first and second control gate stack sidewalls, the first capacitor control gate stack serves as an upper portion of a storage gate of a memory cell,
a first capacitor sidewall dielectric layer disposed on the first control gate stack sidewall,
a capacitor gate having first and second capacitor gate sidewalls, the capacitor gate is disposed adjacent to the first capacitor control gate stack, the first capacitor gate sidewall abuts the first capacitor sidewall dielectric layer, the capacitor gate serves as an access gate of the memory cell,
a control gate electrode of the first capacitor control gate stack serves as a first capacitor plate of the capacitor,
the capacitor gate serves as a second plate of the capacitor, and
the first capacitor sidewall dielectric layer serves as a capacitor dielectric between the first and second capacitor plates.

2. The device of claim 1 wherein the substrate comprises a memory region with the memory cell, and the memory cell comprises:
the storage gate with first and second storage gate sidewalls, the storage gate includes,
a lower portion comprising a floating gate,
the upper portion comprising a control gate on the floating gate and a hard mask on the control gate, and
a storage gate dielectric layer disposed on the first storage gate sidewall; and
the access gate is disposed adjacent to the storage gate, the access gate abuts the storage gate dielectric layer.

3. The device of claim 1 wherein:
the control gate electrode comprises polysilicon;
the capacitor dielectric comprises silicon oxide; and
the capacitor gate comprises polysilicon to produce a polysilicon-insulator-polysilicon (PIP) capacitor.

4. The device of claim 1 wherein the capacitor isolation region comprises a capacitor shallow trench isolation region, the capacitor shallow trench isolation region comprises a capacitor trench filled with an isolation material.

5. The device of claim 1 wherein the capacitor gate comprises a second control gate electrode over a first control gate electrode, wherein the first and second control gate electrode serve as first and second access gate electrodes of the access gate of the memory cell.

6. The device of claim 1 comprising:
a second capacitor control gate stack having first and second gate stack sidewalls of the second capacitor control gate stack and includes a hard mask over a control gate of the second capacitor control gate stack;
a first capacitor sidewall dielectric layer of the second capacitor control gate stack is disposed on the first control gate stack sidewall of the second control gate stack;
wherein the control gate of the second capacitor is disposed adjacent to a second capacitor control gate sidewall with the first capacitor sidewall dielectric layer abutting the second capacitor control gate sidewall; and
wherein the capacitor gate serves as a common electrode of a second capacitor formed by a control gate electrode of the second control gate stack, the first capacitor sidewall dielectric layer of the second control gate stack and the capacitor gate.

7. The device of claim 6 wherein the second capacitor comprises a second PIP capacitor.

8. A method for forming a device, comprising:
providing a substrate with a capacitor isolation region disposed on a surface of the substrate; and
forming a capacitor on the capacitor isolation region, wherein forming the capacitor comprises,
forming a first capacitor control gate stack having first and second control gate stack sidewalls, the first capacitor control gate stack serves as an upper portion of a storage gate of a memory cell,
forming a first capacitor sidewall dielectric layer on the first control gate stack sidewall,
forming a capacitor gate having first and second capacitor gate sidewalls, the capacitor gate is formed adjacent to the first capacitor control gate stack, wherein the first capacitor gate sidewall abuts the first capacitor sidewall dielectric layer, the capacitor gate serves as an access gate of the memory cell, wherein
a control gate electrode of the first capacitor control gate stack serves as a first capacitor plate of the capacitor,
the capacitor gate serves as a second plate of the capacitor, and
the first capacitor sidewall dielectric layer serves as a capacitor dielectric between the first and second capacitor plates.

9. The method of claim 8 further comprising:
forming a memory cell in a memory region, comprising:
forming a storage gate of the memory cell with first and second storage gate sidewalls, wherein forming the storage gate comprises,
forming a lower portion of the storage gate,
forming an upper portion of the storage gate, wherein the upper portion comprises a hard mask over a control gate, wherein forming the upper portion of the storage gate also forms the first capacitor control gate stack in the capacitor isolation region, and
forming a storage gate dielectric layer on the first storage gate sidewall, wherein forming the storage gate dielectric layer also forms the first capacitor sidewall dielectric layer; and
forming an access gate adjacent to the storage gate, the access gate abuts the storage gate dielectric layer, wherein forming the access gate also forms the capacitor gate.

10. The method of claim 8 wherein:
forming the first capacitor control gate stack also forms a second capacitor control gate stack; and the capacitor gate is formed between the first and second capacitor control stacks and abuts the capacitor dielectric layers of the first and second capacitor control gate stacks.

11. The method of claim 10 wherein:

a control gate electrode of the first capacitor control gate stack serves as a first plate of a first capacitor;

a control gate electrode of the second capacitor control gate stack serves as a first plate of a second capacitor; and the capacitor gate serves as a common plate of the first and second capacitors.

12. The method of claim 8 wherein:

the control gate electrode comprises polysilicon;

the first capacitor sidewall dielectric layer comprises silicon oxide; and the capacitor gate comprises polysilicon to produce a PIP capacitor.

* * * * *